United States Patent [19]
Suzuki

[11] Patent Number: 4,547,424
[45] Date of Patent: Oct. 15, 1985

[54] COMPRESSION RESISTANT EXPANDED, POROUS POLYTETRAFLUOROETHYLENE COMPOSITE

[75] Inventor: Hirosuke Suzuki, Tokorozawa, Japan

[73] Assignee: Junkosha Company, Ltd., Tokyo, Japan

[21] Appl. No.: 718,729

[22] Filed: Apr. 1, 1985

[30] Foreign Application Priority Data

Apr. 10, 1984 [JP] Japan .................. 59-72473

[51] Int. Cl.$^4$ ................ B32B 5/22; B32B 5/26; B32B 5/30
[52] U.S. Cl. ............... 428/316.6; 428/319.7; 428/421; 428/422
[58] Field of Search .............. 428/316.6, 319.7, 421, 428/422

[56] References Cited

U.S. PATENT DOCUMENTS

| | | | |
|---|---|---|---|
| 4,236,952 | 12/1980 | Krause et al. | 428/422 |
| 4,252,858 | 2/1981 | Chao et al. | 428/422 |
| 4,283,448 | 8/1981 | Bowman | 428/421 |
| 4,478,898 | 10/1984 | Kato | 428/422 |

Primary Examiner—William J. Van Balen
Attorney, Agent, or Firm—Mortenson & Uebler

[57] ABSTRACT

A composite laminated article is provided, useful for printed circuit boards in transmission of electrical signals in the high frequency range of the order of 10 GHz, comprising a layer of expanded, porous polytetrafluoroethylene (PTFE), maintained in a fully stretched state, affixed firmly to a solid substrate layer. The composite is formed by stretching extruded, unsintered PTFE, after removal of lubricant, holding the stretched PTFE in its fully stretched state, and bonding the stretched PTFE to a substrate. The porous PTFE layer in this composite has unexpectedly high compression resistance.

5 Claims, 5 Drawing Figures

COMPRESSION RESISTANT EXPANDED, POROUS POLYTETRAFLUOROETHYLENE COMPOSITE

BACKGROUND OF THE INVENTION

The present invention relates to a composite containing a stretched porous polytetrafluoroethylene layer which is highly compression resistant.

Stretched porous polytetrafluoroethylene has a low dielectric constant and has low dielectric loss and is not significantly frequency dependent. Therefore it is an outstanding dielectric material which is stable when used in high-frequency electrical applications. Nevertheless, it has the disadvantage of being poor in form stability and particularly being readily deformable under compression. Accordingly, it is an object of this invention to provide a composite article containing a layer of stretched porous polytetrafluoroethylene which is highly compression resistant.

SUMMARY OF THE INVENTION

A composite article is provided comprising a layer of expanded, porous PTFE maintained in a fully stretched state and bonded in laminar contact to a substrate layer which prevents shrinkage of the PTFE layer and provides unexpectedly high compression resistance to the PTFE layer.

The substrate layer can be a non-porous layer of a fluorocarbon selected from the class consisting of polytetrafluoroethylene, fluorinated ethylene-hexafluoropropylene copolymer, perfluoro-vinylalkyl-vinyl ether copolymer, trifluorochloroethylene copolymer and vinylidene fluoride resin, or a fabric made of expanded, porous PTFE fibers. Alternatively, the substrate can be a layer of porous PTFE having a higher specific gravity than the expanded, porous PTFE layer. The expanded, porous PTFE layer may be unsintered, partly sintered or fully sintered.

DETAILED DESCRIPTION OF THE INVENTION AND PREFERRED EMBODIMENTS WITH REFERENCE TO THE DRAWINGS

A composite laminated article is provided, useful for printed circuit boards in transmission of electrical signals in the high frequency range of the order of 10 GHz, comprising a layer of expanded, porous polytetrafluoroethylene (PTFE), maintained in a fully stretched state, affixed firmly to a solid substrate layer. The composite is formed by stretching extruded, unsintered PTFE, after removal of lubricant, holding the stretched PTFE in its fully stretched state, and bonding the stretched PTFE to a substrate. The porous PTFE layer in this composite has unexpectedly high compression resistance.

According to this invention, the composite containing stretched porous polytetrafluoroethylene layer which is compression resistant comprises a stretched porous polytetrafluoroethylene layer and an anti-shrink layer which prevents said layer from shrinking in its stretching direction, said anti-shrink layer being integrally laminated and bonded to said layer.

This structure permits the anti-shrink layer to maintain the stretched porous polytetrafluoroethylene layer stretched in its stretching direction. Thus, this invention provides a superior dielectric material which is surprisingly resistant to compression.

According to the structure of this invention, the anti-shrink layer is a solid layer of fluoroplastic selected from polytetrafluoroethylene, tetrafluoroethylene-hexafluoropropylene copolymer resin, tetrafluoroethylene-perfluoroalkyl-vinyl ether copolymer resin, tetrafluoroethylene-ethylene copolymer resin, trifluorochloroethylene resin, and vinylidene fluoride resin; a cloth made of expanded, porous polytetrafluoroethylene fibers; or a porous polytetrafluoroethylene layer, e.g., an expanded, porous polytetrafluoroethylene layer which has a higher specific gravity than the stretched porous polytetrafluoroethylene layer on which lamination is made. In the case in which the anti-shrink layer is a solid layer of a fluoroplastic, it is heat-treated at a temperature lower than the melting point of the stretched porous polytetrafluoroethylene layer on which lamination is made, so that the anti-shrink layer is partially forced into the pores on the interface of the stretched porous polytetrafluoroethylene layer on which lamination is made. This enhances the stretching effect and reduces deformation under compression. In addition, deformation under compression can be reduced when the stretched porous polytetrafluoroethylene layer is one which has been sintered.

The invention is best described in detail with reference to the embodiments illustrated in FIGS. 1 to 5.

Figure 1:
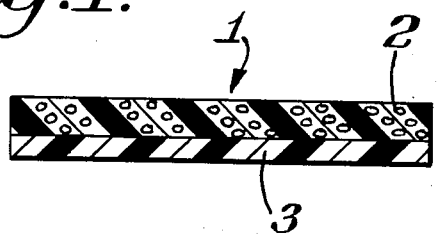
FIG. 1 is a diagrammatic view, partly in cross section, of the composite of this invention showing the stretched porous PTFE layer bonded to a solid fluoroplastic substrate layer.
Figure 2:
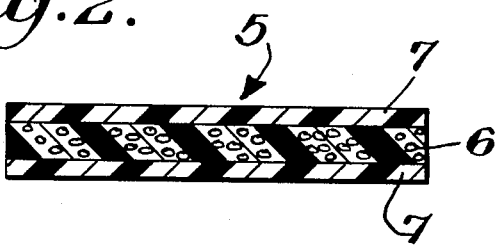
FIG. 2 shows the composite of the invention in which a solid fluoroplastic layer is bonded to both sides of the stretched porous PTFE layer.
Figure 3:
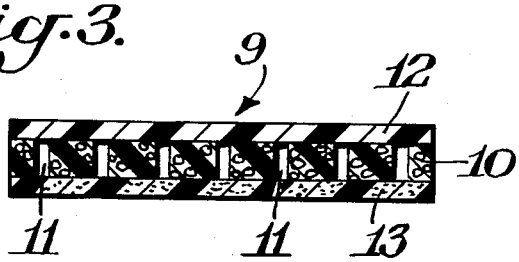
FIG. 3 is a cross-sectional view of the composite of this invention in which the stretched porous PTFE layer is bonded on one side to a solid fluororesin layer and to a cloth of expanded, porous PTFE fibers on the other side.

FIGS. 1 to 3 show those embodiments in which the anti-shrink layer is a solid layer of fluoroplastic selected from polytetrafluoroethylene, tetrafluoroethylene-hexafluoropropylene copolymer resin, tetrafluoroethylene-perfluoroalkyl-vinyl ether copolymer resin, tetrafluoroethylene-ethylene copolymer resin, trifluorochloroethylene resin, and vinylidene fluoride resin.

In FIG. 1 there is shown a stretched porous polytetrafluoroethylene layer 1 which comprises a stretched porous polytetrafluoroethylene layer 2 which has been sintered and a solid layer 3 of polytetrafluoroethylene as the anti-shrink layer which prevents the resin layer 2 from shrinking in its stretching direction, the two layers being integrally laminated together.

In the case of this embodiment, deformation under compression of 100 g/cm$^2$ is 4% when the layer of stretched porous polytetrafluoroethylene has a specific gravity of 0.4. This value is less than one half of the compressive deformation (10%) that takes place when the anti-shrink layer is not used.

In FIG. 2 there is shown a stretched porous polytetrafluoroethylene layer 5 which comprises a stretched porous polytetrafluoroethylene layer 6 which has specific gravity of 0.4 and solid layers 7 of tetrafluoroethyleneperfluoroalkyl-vinyl ether copolymer resin as the anti-shrink layers which prevent the resin layer 6 from shrinking in its stretching direction, the three layers being integrally laminated together.

In the case of this embodiment, deformation under compression of 100 g/cm$^2$ is 2%. This value is one-fifth that of a stretched porous polytetrafluoroethylene layer having no anti-shrink layer bonded thereto.

FIG. 3 is a sectional view of stretched porous polytetrafluoroethylene layer 9 according to still another embodiment of this invention. In this embodiment, the stretched porous polytetrafluoroethylene layer 10 has a multiplicity of through-holes 11 which are intended to reduce the dielectric constant and specific gravity of the composite. The through-holes 11 do not affect the compressive deformation when they account for 25% or less of the total volume of the composite. The through-holes 11 which account for up to about 40% in the total volume are permissible and have little effect on the properties of the composite.

The stretched porous polytetrafluoroethylene layer 10 has, integrally laminated on one side thereof, a solid layer 12 of ethylene-tetrafluoroethylene copolymer resin as the anti-shrink layer, and also has, integrally laminated on the other side thereof, a cloth 13 of sintered, expanded, porous polytetrafluoroethylene fibers.

Figure 4:
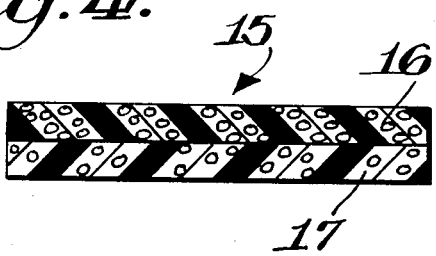
FIGS. 4 and 5 are cross-sectional views of the composite of this invention in which the stretched porous PTFE layer is bonded to a porous PTFE layer or layers having a specific gravity higher than the stretched porous PTFE layer.
Figure 5:
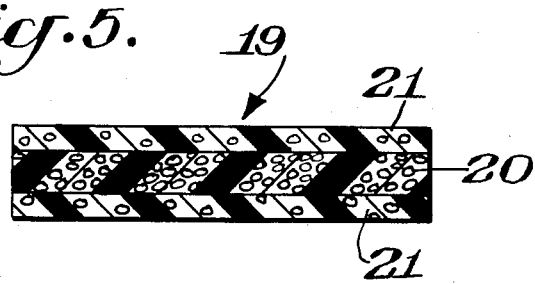

FIGS. 4 and 5 are cross-sectional views of stretched porous polytetrafluoroethylene layers which are compression resistant according to this invention. In these embodiments, the integrally laminated anti-shrink layer is a porous polytetrafluoroethylene layer which has a higher specific gravity than the stretched porous polytetrafluoroethylene layer on which lamination is made.

In the case of the embodiment shown in FIG. 4, the stretched porous polytetrafluoroethylene layer 16 is integrally laminated with the stretched porous polytetrafluoroethylene layer as the anti-shrink layer having a specific gravity of 0.68. In this case, the compressive deformation is 5%, which is approximately half that in the case where the anti-shrink layer is not used.

In the case of the stretched porous polytetrafluoroethylene layer 19 shown in FIG. 5, the stretched porous polytetrafluoroethylene layer 20 having a low specific gravity has, integrally laminated on both sides thereof, the expanded, porous polytetrafluoroethylene layers 21 as the anti-shrink layers which have a higher specific gravity than the resin layer 20.

Another embodiment, although not shown, may be possible in which a stretched porous polytetrafluoroethylene layer as an anti-shrink layer having a higher specific gravity is integrally laminated on both sides thereof with stretched porous polytetrafluoroethylene layers haing a lower specific gravity.

According to this invention as mentioned above, the composite containing a stretched porous polytetrafluoroethylene layer which is highly compression resistant comprises a stretched porous polytetrafluoroethylene layer and an anti-shrink layer which prevents said resin layer from shrinking in its stretching direction, said anti-shrink layer being integrally laminated to said resin layer. The anti-shrink layer maintains the stretched porous polytetrafluoroethylene stretched in its stretching direction, and prevents and stretched porous polytetrafluoroethylene layer from deforming under compression. Thus, the present invention provides a superior dielectric material. The composite containing the stretched porous polytetrafluoroethylene of this invention, into which an anti-shrink layer is integrally laminated, can be used as an insulating material which is superior in signal transmission performance due to low dielectric loss and is also superior in both volume resistance and surface resistance, with a minimum of migration between conductors.

The invention is not limited to the above-mentioned embodiments, but may be modified without departing from the scope of this invention. For example, the combination of the stretched porous polytetrafluoroethylene layer and the anti-shrink layer may be properly selected for integral lamination. The temperature for heat-treatment of the anti-shrink layer of solid fluoroplastic may be properly selected. The stretched porous polytetrafluoroethylene layer may be unsintered, partially sintered, or fully sintered.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A composite article comprising a layer of expanded, porous PTFE maintained in a fully stretched state and bonded in laminar contact to a substrate layer which prevents shrinkage of the PTFE layer and provides high compression resistance to said PTFE layer.

2. The composite of claim 1 wherein said substrate layer is a non-porous layer of a fluorocarbon selected from the class consisting of polytetrafluoroethylene, fluorinated ethylene-hexafluoropropylene copolymer, perfluoro-vinylalkyl-vinyl ether copolymer, trifluorochloroethylene copolymer and vinylidene fluoride resin.

3. The composite of claim 1 wherein said substrate is a fabric made of expanded, porous PTFE fibers.

4. The composite of claim 1 wherein said substrate is a layer of porous PTFE having a higher specific gravity than said expanded, porous PTFE layer.

5. The composite of claim 1 wherein said expanded, porous PTFE layer is sintered.

* * * * *